(12) United States Patent
Klein et al.

(10) Patent No.: US 7,732,883 B2
(45) Date of Patent: Jun. 8, 2010

(54) INTERMEDIATE OPTICAL PACKAGES AND SYSTEMS COMPRISING THE SAME, AND THEIR USES

(75) Inventors: Dean A. Klein, Boise, ID (US); Ian Blasch, Boise, ID (US)

(73) Assignee: Aptina Imaging Corp., Grand Cayman (KY)

( * ) Notice: Subject to any disclaimer, the term of this patent is extended or adjusted under 35 U.S.C. 154(b) by 0 days.

(21) Appl. No.: 12/244,726

(22) Filed: Oct. 2, 2008

(65) Prior Publication Data

US 2009/0090924 A1 Apr. 9, 2009

Related U.S. Application Data

(62) Division of application No. 11/713,010, filed on Mar. 2, 2007, now Pat. No. 7,446,385.

(51) Int. Cl.
*H01L 31/0232* (2006.01)

(52) U.S. Cl. .............. 257/432; 257/98; 257/E31.127; 257/E33.068; 438/69; 438/27; 438/29

(58) Field of Classification Search ................ 257/432, 257/E31.127, 98, E33.068; 438/69, 27, 29
See application file for complete search history.

(56) References Cited

U.S. PATENT DOCUMENTS

| 7,023,022 | B2 | 4/2006 | Eliashevich et al. |
| 7,072,086 | B2 | 7/2006 | Batchko |
| 2005/0275048 | A1* | 12/2005 | Farnworth et al. .......... 257/431 |
| 2006/0105485 | A1* | 5/2006 | Basin et al. .................. 438/27 |
| 2006/0114534 | A1 | 6/2006 | Batchko |
| 2007/0121213 | A1* | 5/2007 | Tseng et al. ................ 359/628 |
| 2007/0217019 | A1* | 9/2007 | Huang et al. ................ 359/642 |

* cited by examiner

*Primary Examiner*—Tu-Tu V Ho
(74) *Attorney, Agent, or Firm*—Dickstein Shapiro LLP

(57) ABSTRACT

Methods and apparatuses for forming optical packages, and intermediate structures resulting from the same are disclosed, which provide an optical element over a device. The optical element is formed by applying a force to lateral portions of a liquid material layer formed below an elastomeric material layer such that the liquid material layer has a radius of curvature sufficient to direct light to a light sensitive portion of the device, after which the liquid material layer is exposed to conditions which maintain the radius of curvature after the lateral force is removed.

12 Claims, 15 Drawing Sheets

INTERMEDIATE OPTICAL PACKAGES AND SYSTEMS COMPRISING THE SAME, AND THEIR USES

This application is a divisional application of application Ser. No. 11/713,010, filed on Mar. 2, 2007, now U.S. Pat. No. 7,446,385 which is hereby incorporated herein by reference in its entirety.

FIELD OF THE INVENTION

The embodiments described herein relate to methods of fabricating optical packages and systems having the same and, more particularly, to an adaptive formation of optical elements, and uses thereof.

BACKGROUND OF THE INVENTION

Conventional optical packages, which comprise an optical element formed in association with a corresponding imager, are often made simultaneously such that hundreds or even thousands of optical packages are formed on a single wafer. The wafer is then diced to create individual optical packages that are subsequently incorporated into digital systems, such as, for example, digital cameras, digital displays, and other light receiving or light emitting devices.

One drawback of forming multiple optical packages on a single wafer is that optical precision across an entire wafer on which optical elements are typically formed is inconsistent. Each imager has its own optical variation due to slight misalignments during its fabrication. For example, a first imager may have an ideal focal depth at which light is absorbed that is different from a second imager formed on the same substrate, even one that may be adjacent to the first imager. Conventional methods of forming optical elements, however, do not account for the individual focal lengths for each imager. As a result, conventional methods of forming optical elements may not achieve the ideal focal properties required in high end digital systems, such as, for example, digital cameras, digital displays, and other light receiving or light emitting devices.

Accordingly, there is a desire and need for a method of fabricating multiple optical packages with optical elements that are tailored to each imager to mitigate against the shortcomings of conventional optical packages.

DETAILED DESCRIPTION OF THE INVENTION

In the following detailed description, reference is made to various specific embodiments. These embodiments are described with sufficient detail to enable those skilled in the art to practice the embodiments, and it is to be understood that other embodiments may be employed, and that structural and electrical changes may be made.

The term "substrate" used in the following description may include any supporting structure including, but not limited to, a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate or wafer in the following description, previous process steps may have been utilized to form regions or junctions in or over the base semiconductor or foundation. The substrate also need not be semiconductor-based, but may be any support structure suitable for supporting an integrated circuit, including, but not limited to, metals, alloys, glasses, polymers, ceramics, and any other supportive materials as is known in the art.

As used herein, the term "elastomeric material" and "flexible material" are to be understood to include any material, including, but not limited to, epoxy, polyimide, polyester, or any other material capable of withstanding a 180° angle bend at a radius of at least ⅛ inch or less. Similarly, an "elastomeric material" or "flexible material" may be any material having substantially the same or equivalent properties as DuPont Kapton® or Oasis®. Specifically, the material may have a tensile strength of about 10 kpsi or greater, a tensile modulus of about 200 kpsi or greater, and/or an elongation property of about 25% or more (values based on ASTM D-882-83 Method A).

Figure 1:
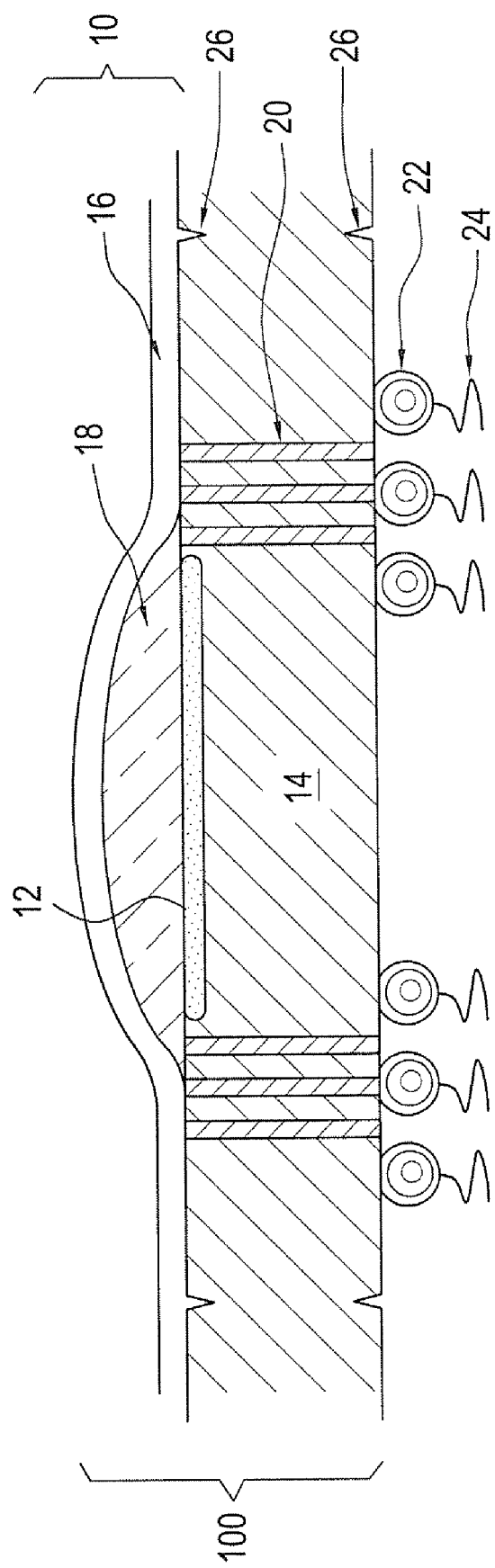
FIG. 1 illustrates a partial cross-sectional view of an optical package constructed in accordance with an embodiment discussed herein.

Embodiments are now explained with reference to the figures, throughout which like reference numbers indicate like features. FIG. 1 is a partial cross-sectional view of an optical package 100 having an optical element 10 capable of being adjusted such that the optical element 10 focuses light onto a light sensing region 12 of the optical package 100. The adjustability of the focal depth associated with the optical element 10 allows for more efficient light capture by the light sensing region, and a clearer resulting picture (in the case the optical package 100 is included in a digital camera system, as discussed below with respect to FIG. 13).

The FIG. 1 optical package 100 includes a wafer 14 supporting the light sensing region 12. The light sensing region 12 could comprise hundreds or even thousands of pixel cells, each having a photosensitive region; the photosensitive regions could be photodiodes, photogates, photosensors, or any combination thereof. The optical element 10 is formed over the light sensing region 12. The optical element 10 comprises an elastomeric membrane 16 formed over a material layer 18. The material layer 18 may comprise any transparent material that has an initially fluid state capable of being hardened upon exposure to appropriate conditions, such as, for example, ultraviolet radiation (e.g., UV light) or heat (in the case of, for example, thermally cured compounds).

Additional components of the FIG. 1 optical package 100 include thru-wafer interconnects 20, which may connect to solder balls 22 connected to probe contacts 24. The solder balls 22 and probe contacts provide electrical connectivity from the light sensing region 12 of the optical package 100 to peripheral circuitry.

It should be noted that a plurality of optical packages (e.g., optical package 100) is typically formed on a single wafer that is subsequently diced to create individual optical packages. The illustrated wafer 14 provides scribes 26 (illustrated schematically) that are used to dice the wafer 14 to create individual optical packages 100 that are typically incorporated into digital systems, such as, for example, digital cameras, digital displays, and other light receiving or light emitting devices.

It should also be noted that although described as a light sensing region 12 capable of capturing light, the embodiments of the invention are not so limited. For example, the light sensing region 12 could instead be a light emitting region such as those used in Liquid Crystal Display (LCD) devices. For simplified description, region 12 is described as a light sensing region 12, which may be used, for example, in CMOS, CCD or other solid state image capturing devices.

Figure 2:
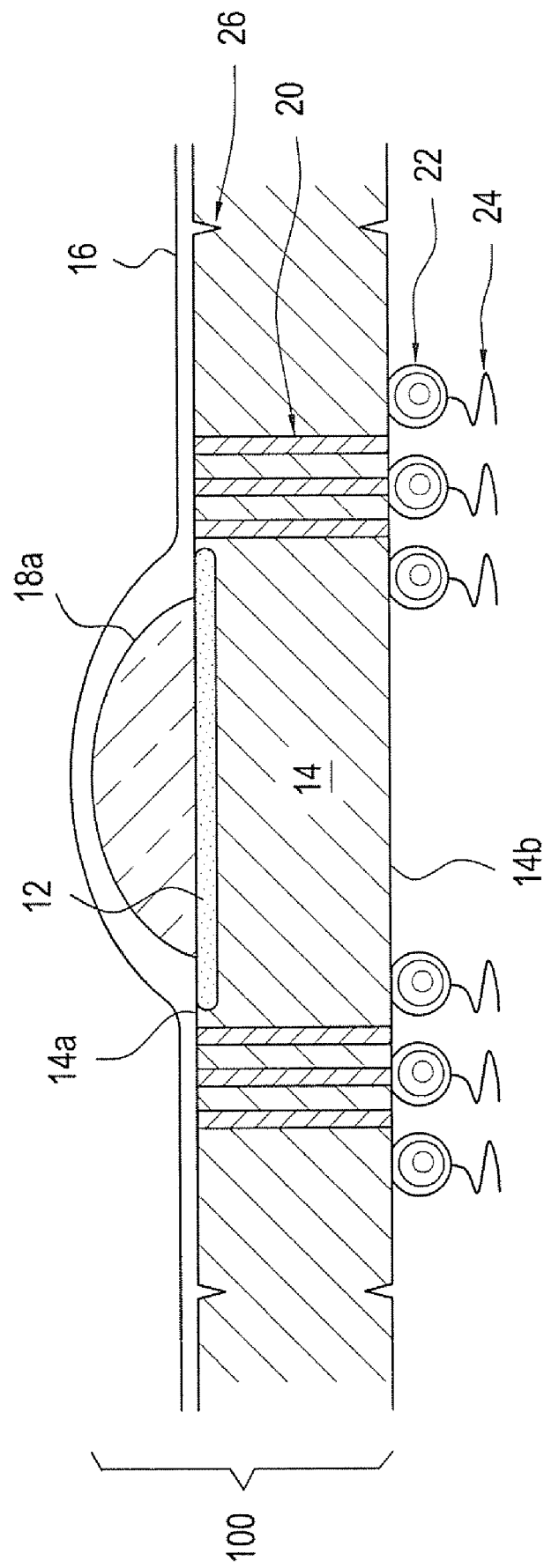
FIGS. 2-5 illustrate partial cross-sectional views of an embodiment of fabricating the optical package illustrated in FIG. 1.

FIGS. 2-5 illustrate an embodiment of a method of forming the FIG. 1 optical package 100. Specifically, FIG. 2 illustrates the light sensing region 12 formed in association with the wafer 14. As illustrated, the light sensing region 12 is formed at a topmost surface 14a of the wafer 14; it should be noted, however, that the illustration is not intended to be limiting in any way. For example, the light sensing region 12 could be formed over the topmost surface 14a of the wafer 14 or at a predetermined depth below the topmost surface 14a of the wafer 14. Indeed, the light sensing region 12 could be a backside illuminated region that is formed in association with a bottom most surface 14b of the wafer 14.

The FIG. 2 wafer 14 includes the thru-wafer interconnects 20 that may connect with solder balls 22 connected to probe contacts 24. The solder balls 22 and probe contacts 24 may provide electrical connectivity from the light sensing region 12 of the optical package 100 to peripheral circuitry. The scribes 26 are also provided; it should be noted, however, that the scribes 26 can be formed subsequent to the formation of the material layer 18 (FIG. 1), and need not be provided in the wafer 14 at this stage.

FIG. 2 also illustrates a drop of a material layer precursor 18a formed between the light sensing region 12 and the elastomeric membrane 16. The illustrated material layer precursor 18a has a shapeable fluid form, and may be selected from any negative photoresist known in the art, such as, for example, SU-8 (IBM), or NR9-1500PY (Norland). Alternatively, the material layer precursor 18a may also be selected from any polymer capable of being hardened, such as, for example, polydimethylsiloxane (PDMS) polymer or polyethylene terephthalate (PET).

It should be noted that the listed compounds are merely examples of the classes of materials the material layer precursor 18a could comprise, and is not intended to be limiting in any way. For example, the material layer precursor 18a could be formed of any material that is capable of being deposited in an amorphous state and subsequently hardened to retain its hardened shape at room temperature.

Figure 3:
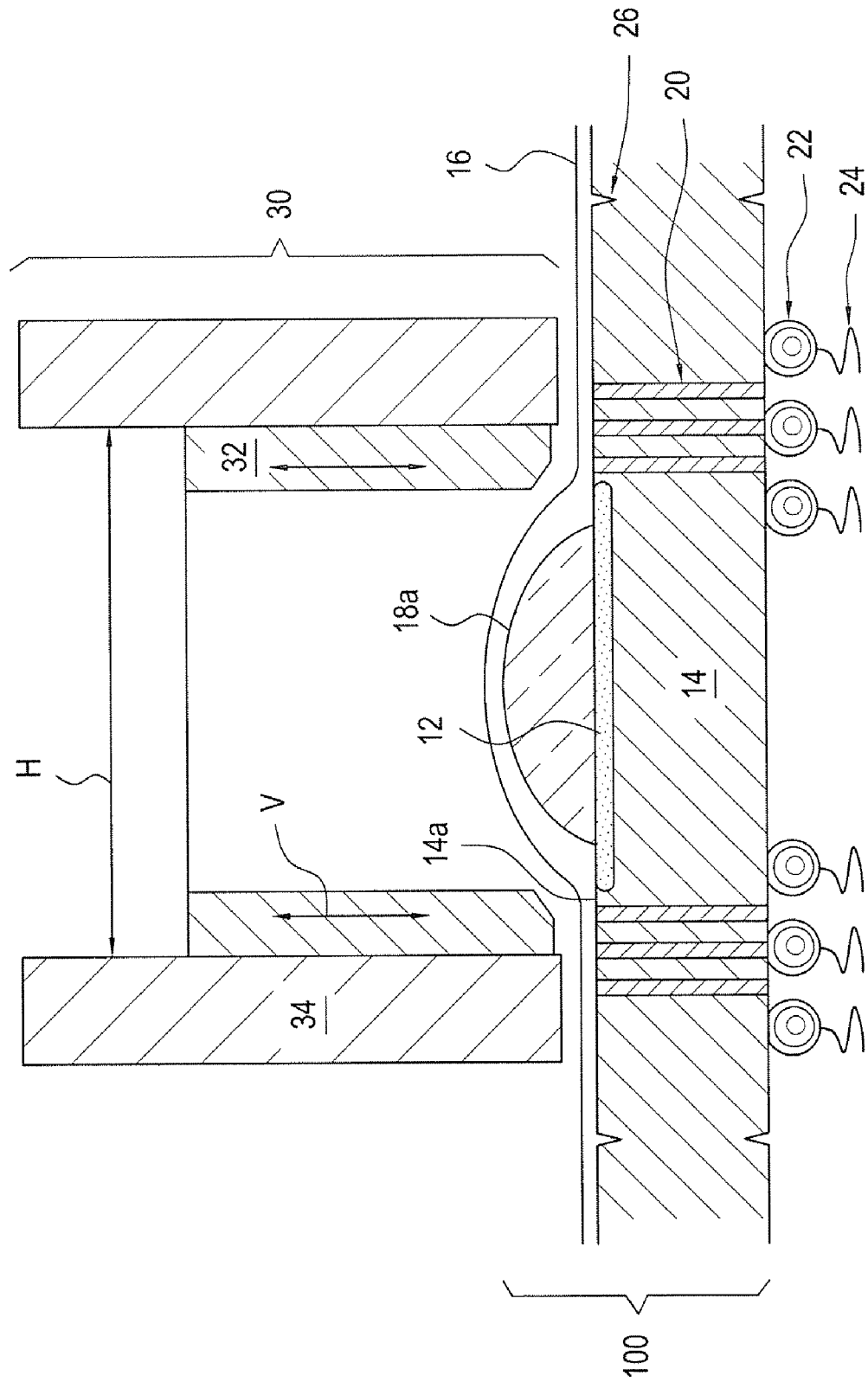

FIG. 3 illustrates a shaping element 30 that includes vertical and horizontal structures 32, 34 provided over the elastomeric membrane 16. The illustrated vertical structure 32 is adjustable in a vertical direction (i.e., in a direction substantially perpendicular to the topmost surface 14a of the wafer) as illustrated by arrows V. The illustrated horizontal structure 34 is adjustable in a horizontal direction (i.e., in a direction substantially parallel to the topmost surface 14a of the wafer) as illustrated by arrows H.

Figure 4:
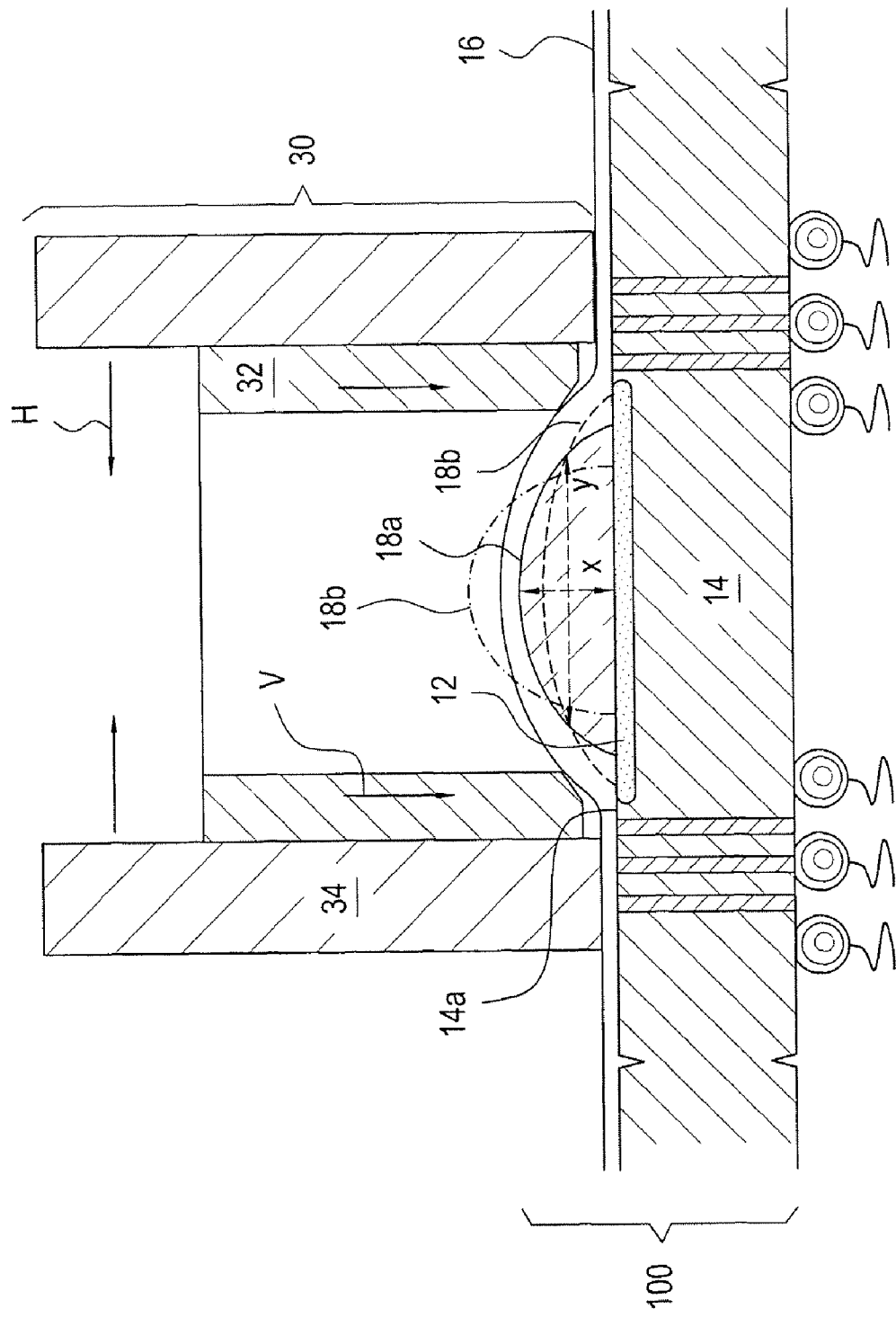

As illustrated in FIG. 4, the vertical and horizontal structures 32, 34 are used to exert pressure (at every angle) on the elastomeric membrane 16 to change the shape of the material layer precursor 18a in both height (x) and width (y); the changes in shape (e.g., 18b, 18c) of the material layer precursor 18a allows for the adjustment of the focal depth of the resulting material layer 18 (FIG. 1). The radius of curvature (as measured from the topmost surface 14a of the wafer 14) can be adjusted to achieve a desired focal depth of light passing through the resulting material layer 18 (FIG. 1).

Figure 5:
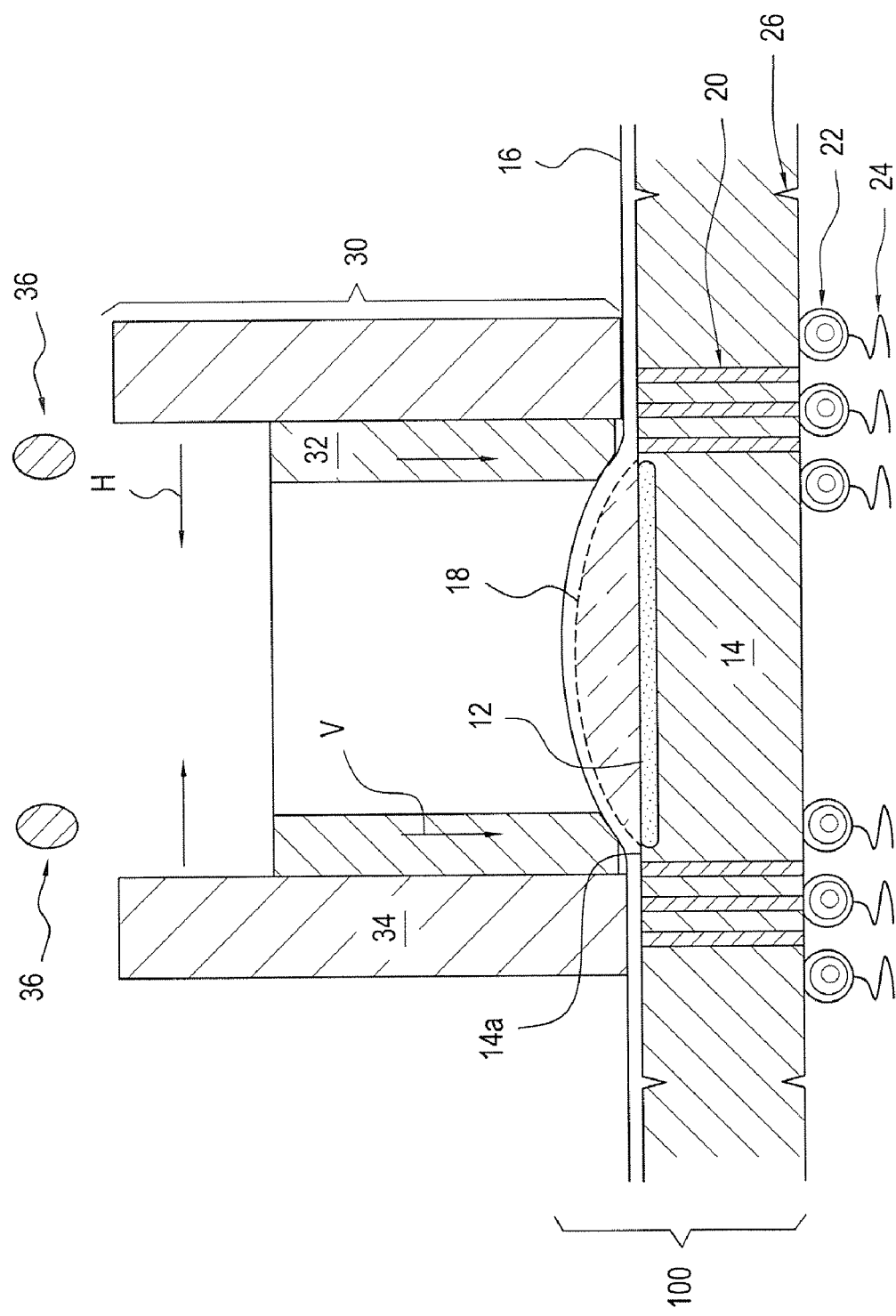

Once a desired focal depth has been achieved, the material layer precursor 18a is exposed to curable condition such as, for example, ultraviolet (UV) radiation emitted from a pair of UV sources 36, as illustrated in FIG. 5, which is positioned over the material layer precursor 18a. The exposure to UV radiation polymerizes the material layer precursor 18a to result in a hardened material layer 18 that serves as a lens. The shaping element 30 can be removed, and the optical package 100 can be separated from adjacent optical packages on the wafer 14.

It should be noted that the material layer precursor 18a could be formed of a thermally cured compound in which case the UV sources 36 would be replaced by heating elements. The heating elements would expose the entire optical package 100 to heat, and cure (or harden) the material layer precursor 18a comprising a thermally curable compound. It should also be noted that other materials that are have an initially fluid state that can be hardened upon exposure to certain conditions could also be implemented in the embodiments illustrated in FIGS. 1-5 discussed above, and FIGS. 6-12 discussed herein.

Figure 6:
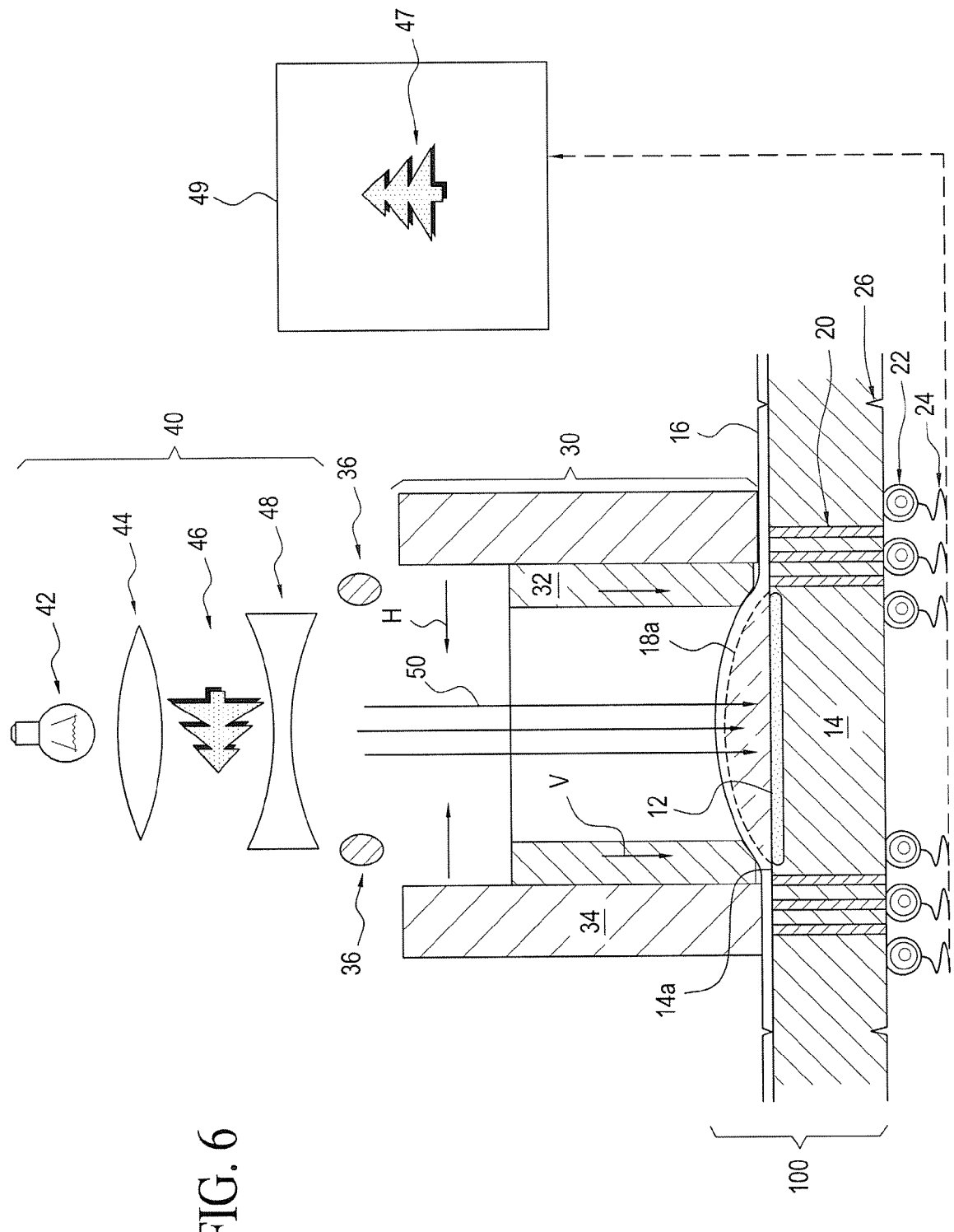
FIG. 6 illustrates a partial cross-sectional view of an optional step of fabricating the optical package illustrated in FIG. 1.

FIG. 6 illustrates a partial cross-sectional view of an optional step performed between the steps illustrated in FIGS. 4 and 5. Specifically, during the adjustment of the material layer precursor 18a (FIG. 4) and prior to curing the material layer precursor 18a (FIG. 5), a probe fixture 40 is placed over the optical package 100 to test the resulting image taken and output by the optical package 100. The illustrated probe fixture 40 includes a light source 42, a first lens layer 44, a test image 46, and a second lens layer 48. Generally speaking, the test image 46 is placed between the light source 42 and the optical package 100 such that the light sensing region 12 captures light 50 from the test image 46, and displays the captured image 47 on a peripheral display device 49, such as, for example, a computer screen or Liquid Crystal Display (LCD) monitor.

The height (x) and width (y) (FIG. 4) of the material layer precursor 18a can be adjusted by the shaping element 30 if the displayed image 47 is out of focus. Once the material layer precursor 18a is adjusted by the shaping element 30 such that the displayed image 47 is in focus, the material layer precursor 18a is hardened (in this example, the material layer precursor 18a is exposed to UV radiation by the UV sources 36, polymerizing the material layer precursor 18a).

The probe fixture 40 allows for probe-time testing of the image quality of the optical package 100 prior to fixing the shape of the material layer 18 (FIG. 1). By having the capability of changing the shape of the material layer 18 (FIG. 1), the focal length of the material layer 18 (FIG. 1) can be varied for each particular optical package 100 on the wafer 14.

Figure 7:
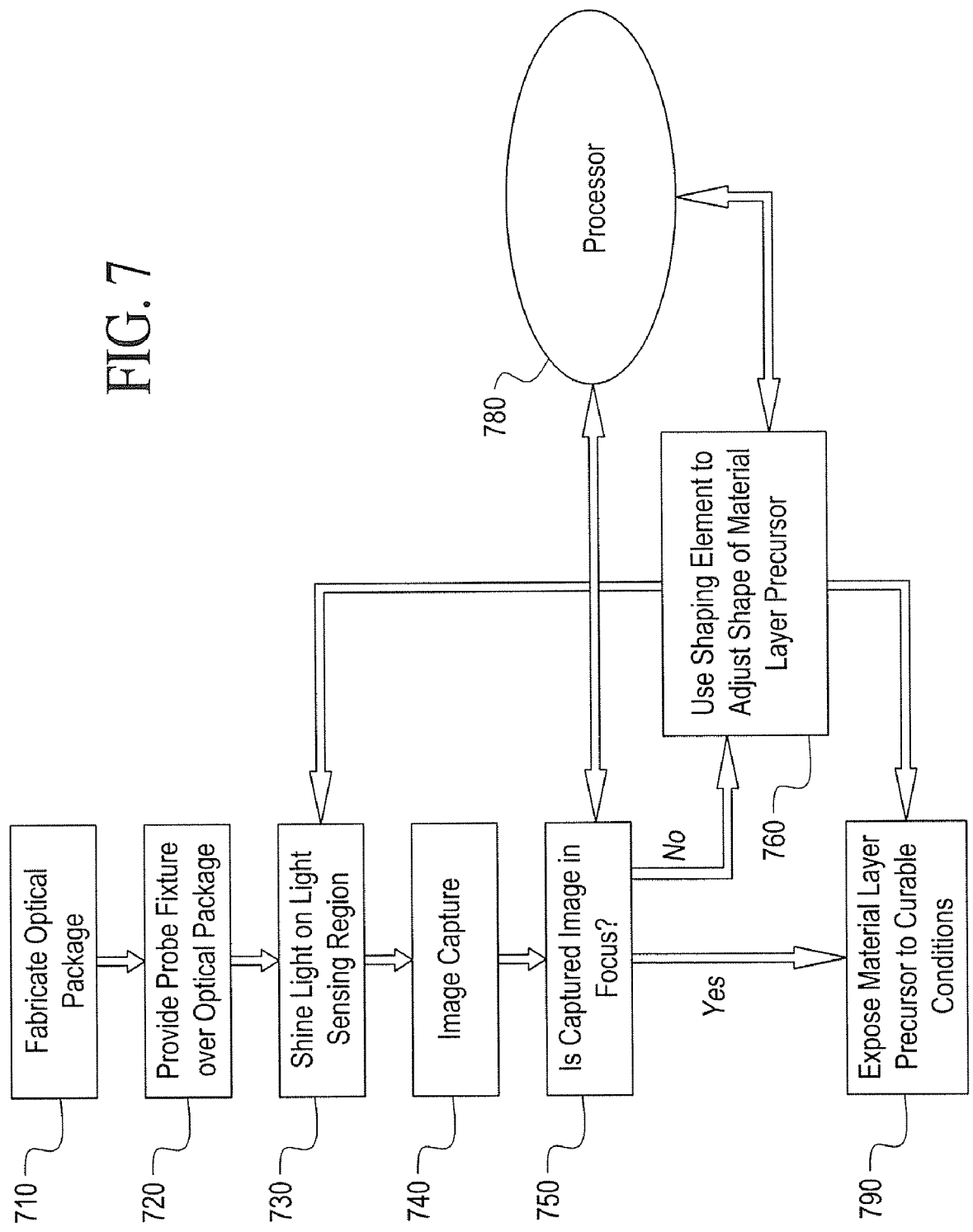
FIG. 7 illustrates a flow chart of optional steps of fabricating the FIG. 1 optical package 100.

The probe testing of the image quality of the optical package 100 can be performed automatically. FIG. 7 illustrates a flow chart of automatic processing of the optical package 100 (FIG. 6). Specifically, step 710 illustrates fabricating the optical package 100 (FIG. 1) with the material layer precursor 18a (FIG. 6) in a substantially fluid state. The probe fixture 40 (FIG. 6) is provided over the optical package 100 (FIG. 6) in step 720. The light sensing region 12 of the optical package 100 (FIG. 6) is subsequently exposed to light 50 (FIG. 6) in step 730, and an image is captured by the optical package 100 (FIG. 6) in step 740. The captured image 47 (FIG. 6) is subsequently analyzed to determine whether it is in focus in step 750; if the captured image 47 (FIG. 6) is not in focus (a "NO" response after step 750), the shaping element 30 (FIG. 6) is adjusted to direct the shape of the material layer precursor 18a (FIG. 6) in step 760.

A processor 780 may determine whether the captured image 47 (FIG. 6) is in focus, and whether an adjustment is required based on the determination that the captured is either in or out of focus. The processor 780 may have bi-directional communication capabilities with the optical package 100 (FIG. 6) and the shaping element 30 (FIG. 6). The processor 780 may drive the adjustments of the shaping element 30 (FIG. 6).

Once the desired adjustments are made to the material layer precursor 18a (FIG. 6), the material layer precursor 18a (FIG. 6) may be exposed to curable conditions in step 790. The curable conditions cure the material layer precursor 18a (FIG. 6) such that it hardens, and maintains its shape. In an optional step, the optical package 100 (FIG. 6) is retested by shining light onto the light sensing region 12 of the optical package 100 (FIG. 6) in step 730, and the process repeats itself (steps 740, 750, 760) until the captured image 47 (FIG. 6) is in focus (a "YES" response after step 750), and the material layer precursor 18a (FIG. 6) is exposed to curable conditions in step 790. As discussed above, the curable conditions cure the material layer precursor 18a (FIG. 6) such that it hardens, and maintains its shape.

Figure 8:
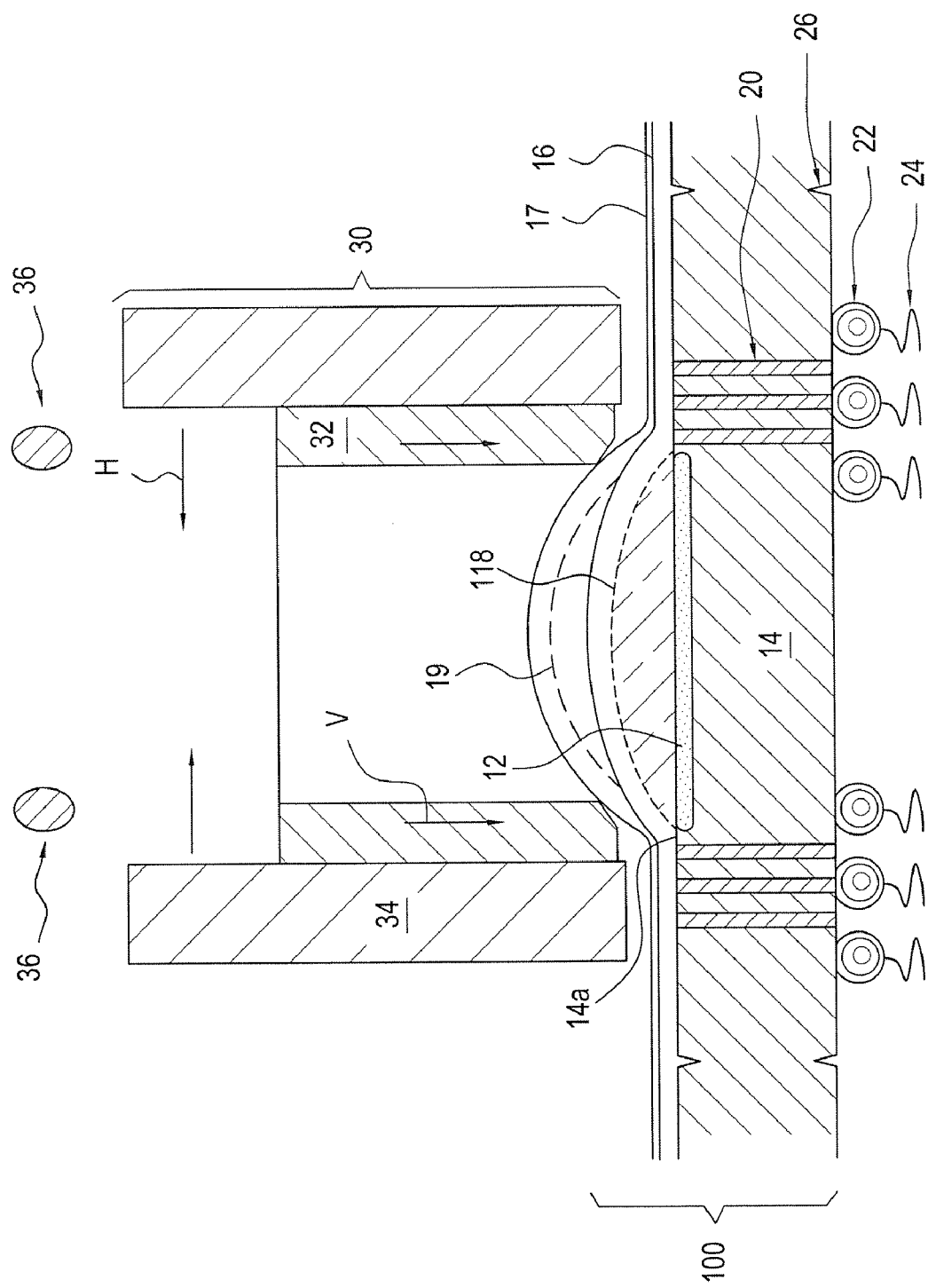
FIG. 8 illustrates a partial cross-sectional view of an optional step of processing the FIG. 4 structure in accordance with a second embodiment discussed herein.

FIG. 8 illustrates a partial cross-sectional view of another optional step performed after the formation of the FIG. 5 structure. A second material layer precursor 19 is formed over the material layer 118. The second material layer precursor 19 could have substantially similar properties as the material layer precursor 18 (FIG. 4); for example, the second material layer precursor 19 could have a substantially fluid state. A second elastomeric membrane 17 is formed over the second material layer precursor 19, and the shaping element 30 is used to shape the second material layer precursor in a substantially similar manner as that discussed above with respect to FIG. 4. Once the second material layer precursor 19 has achieved the desired shape, it can be cured in a substantially similar manner as the precursor material layer 18 (FIG. 4), as discussed above with respect to FIG. 5.

Although illustrated as being formed over the cured material layer 118, it should be noted that the precursor material layer 18 (FIG. 4) and the second material layer precursor 19 could be shaped by the shaping element 30 simultaneously. It should also be noted that the optional steps discussed above with respect to FIG. 7 could be performed on the FIG. 8 structure (or any other structure discussed below) prior to exposing it to curable conditions. Additional precursor materials having substantially similar properties as the material layer precursor 18 and the second material layer precursor 19 could be formed as an optical stack element focusing light 50 (FIG. 6) onto the light sensing region 12.

Figure 9:
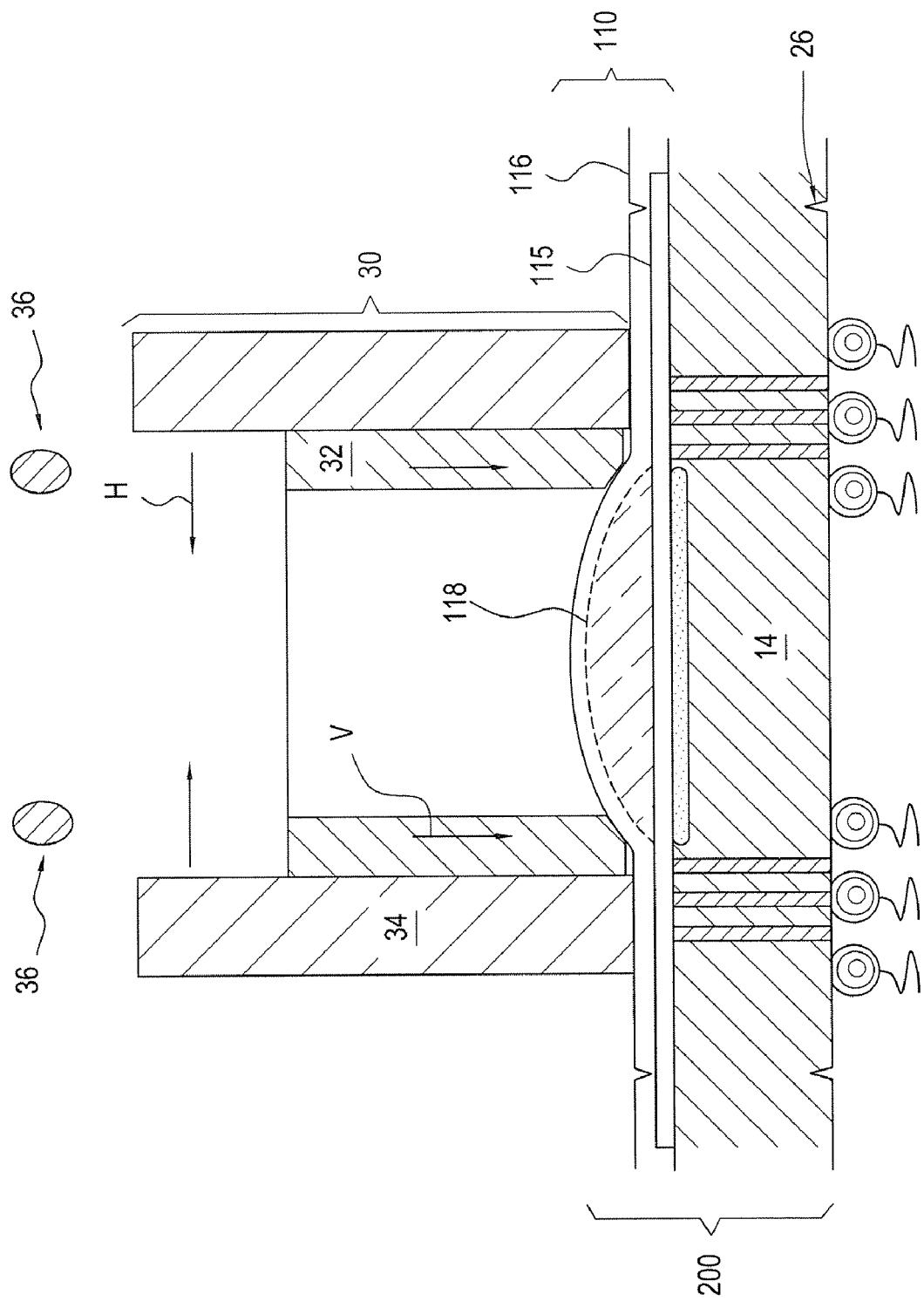
FIG. 9 illustrates a partial cross-sectional view of an optical package constructed in accordance with a third embodiment discussed herein.

FIG. 9 illustrates a partial cross-sectional view of a third embodiment of an optical package 200 formed in a substantially similar manner as the FIG. 1 optical package 100, discussed above with respect to the embodiments illustrated in FIGS. 2-7. The FIG. 8 optical package 200 has an optical element 110 that includes a material layer 118 formed between an elastomeric material layer 116 and a planarizing layer 115.

Figure 10:
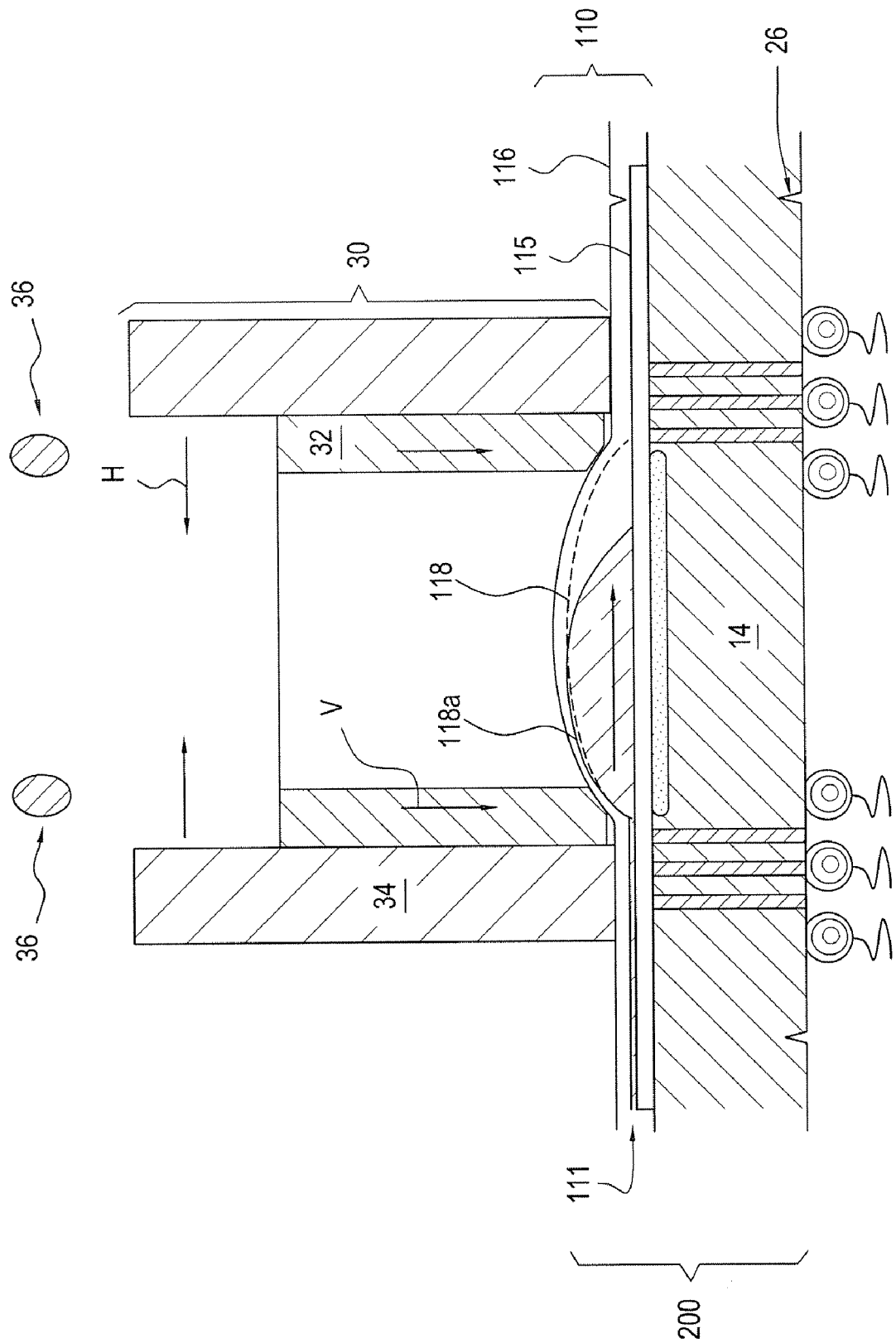
FIG. 10 illustrates a partial cross-sectional view of an embodiment of fabricating the optical package illustrated in FIG. 9.

As illustrated in FIG. 10, the FIG. 9 material layer 118 is formed by squeezing a material layer precursor 118a, having a substantially fluid state, in a space 111 formed between the elastomeric material layer 116 and the planarizing layer 115. The planarizing layer 115 could be formed of any substantially transparent material, including, but not limited to, a material forming the elastomeric material layer 116.

Once the fluid material layer precursor 118a is inserted between the elastomeric material layer 116 and the planarizing layer 115, the material layer precursor 118a can be positioned (indicated by the dashed line 118) over the light sensing region 12. The shaping element 30 then exerts pressure on the elastomeric material layer 116 to direct the shape of the material layer precursor 118a formed below the elastomeric material layer 116. Once the desired characteristics (or shape) of the material layer precursor 118a is achieved, the material layer precursor 118a is exposed to curable conditions; in this example, the curable condition includes UV radiation from the pair of UV sources 36.

The optical package 200 of FIGS. 9 and 10 allow blanket deposition of material layers (e.g., the elastomeric material layer 116 and the planarizing layer 115) prior to forming the material layer 118 (FIG. 9). The insertion of the material layer precursor 118a through the space 111 (FIG. 10) allows formation of the material layer 118 (FIG. 9) over select light sensitive regions 12 in the array. This allows flexibility in the fabrication process.

FIG. 10 illustrates a partial cross-sectional view of a fourth embodiment in which an optical package 300 includes an optical element 210 comprising a shaping lens layer 215, a material layer 218, and an elastomeric material layer 216. The shaping lens layer 215 reduces the amount of pressure required to shape the material layer 218 through use of the shaping element 30.

Figure 11:
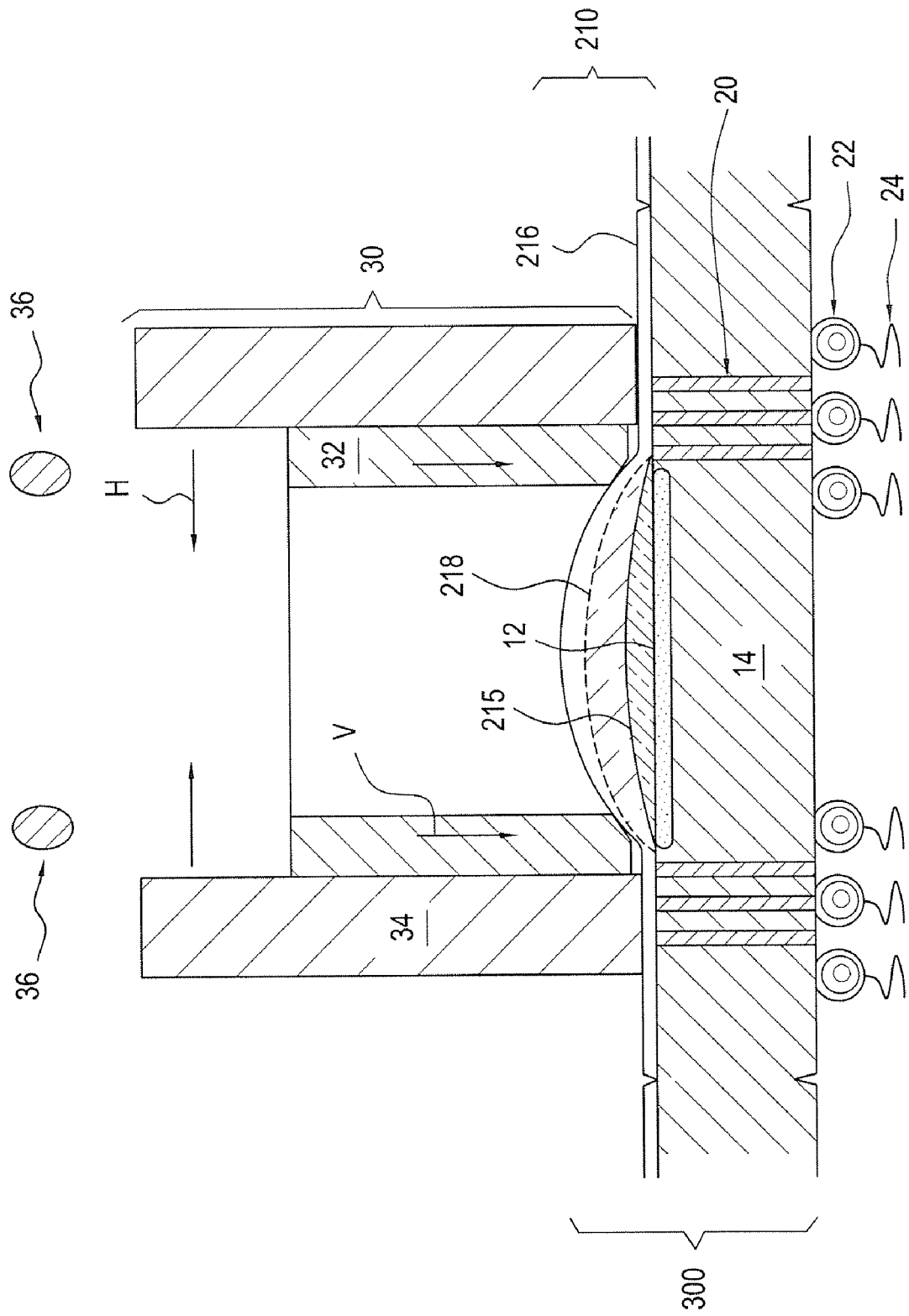
FIG. 11 illustrates a partial cross-sectional view of an optical package constructed in accordance with a fourth embodiment discussed herein.

Other components of the FIG. 11 optical package 300 include a wafer 14 having thru-wafer interconnects 20 that may connect with solder balls 22 and probe contacts 24. The solder balls 22 and probe contacts 24 provide electrical connectivity from the light sensing region 12 of the optical package 300 to peripheral circuitry. Scribes 26 are also provided for dicing the optical package 300 from adjacent optical packages on the wafer 14 (as discussed below with respect to FIG. 14 in relation to optical package 100 of FIG. 1).

The shaping lens layer 215 can be formed by any conventional method of forming lens layers, such as, for example, conventional pattern and reflow methods. The material layer 218 is formed over the shaping lens layer 215 after reflow, and the elastomeric material layer 216 is formed over the material layer 218. Once the material layer 218 has been adjusted, the UV source 36 emits UV radiation that polymerizes the material layer 218 over the light sensing region 212. The shaping lens layer 215 could be formed of any substantially transparent material including, but not limited to, the same material selected for the material layer 218. If the shaping lens layer 215 is formed of a curable material, such as a photoresist, for example, the shaping lens layer 215 is exposed to curable conditions prior to formation of the material layer 218.

Figure 12:
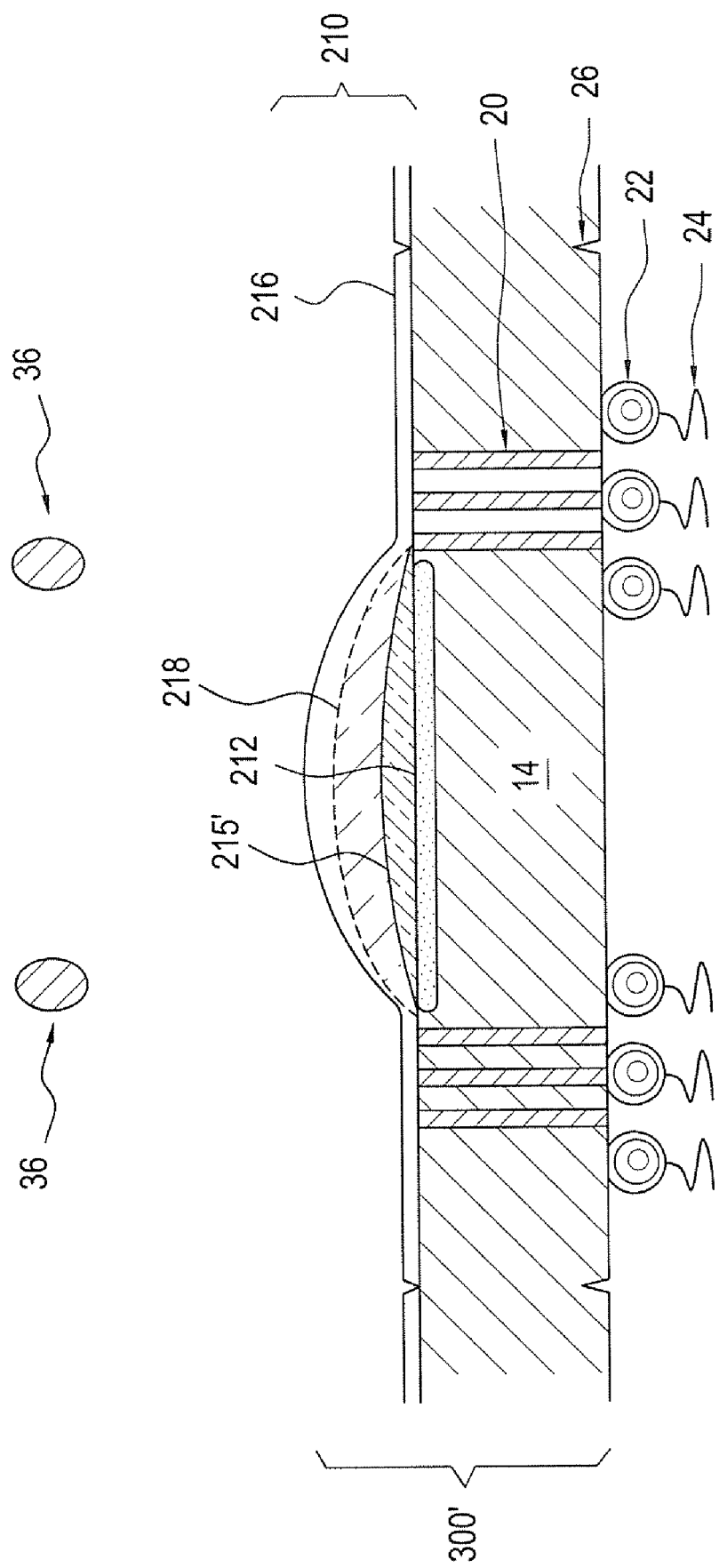
FIG. 12 illustrates a partial cross-sectional view of an optical package constructed in accordance with a fourth embodiment discussed herein.

In an alternative embodiment, illustrated in FIG. 12, the optical package 300' shaping lens layer 215' could be formed of a liquid, gas, gel, or any other non-solid material. The shaping lens layer 215' could be formed by injecting the selected material (e.g., gas, liquid, gel, etc.) below the material layer 218 prior to polymerization. The injected material can form the lens shaping layer 215' as a bubble below the surface of the material layer 218. The injected lens shaping layer 215' could also be suitably controlled such that the shaping element 30 (FIG. 11) need not be used at all. Once the injected shaping layer 215' is injected to a sufficient volume, and the material layer 218 has achieved a desired shape, the UV sources 36 can emit UV radiation to cure the material layer 218. It should be noted, however, that the shaping element 30 (FIG. 11) can also be used during the fabrication of the FIG. 12 optical package 300'.

Figure 13:
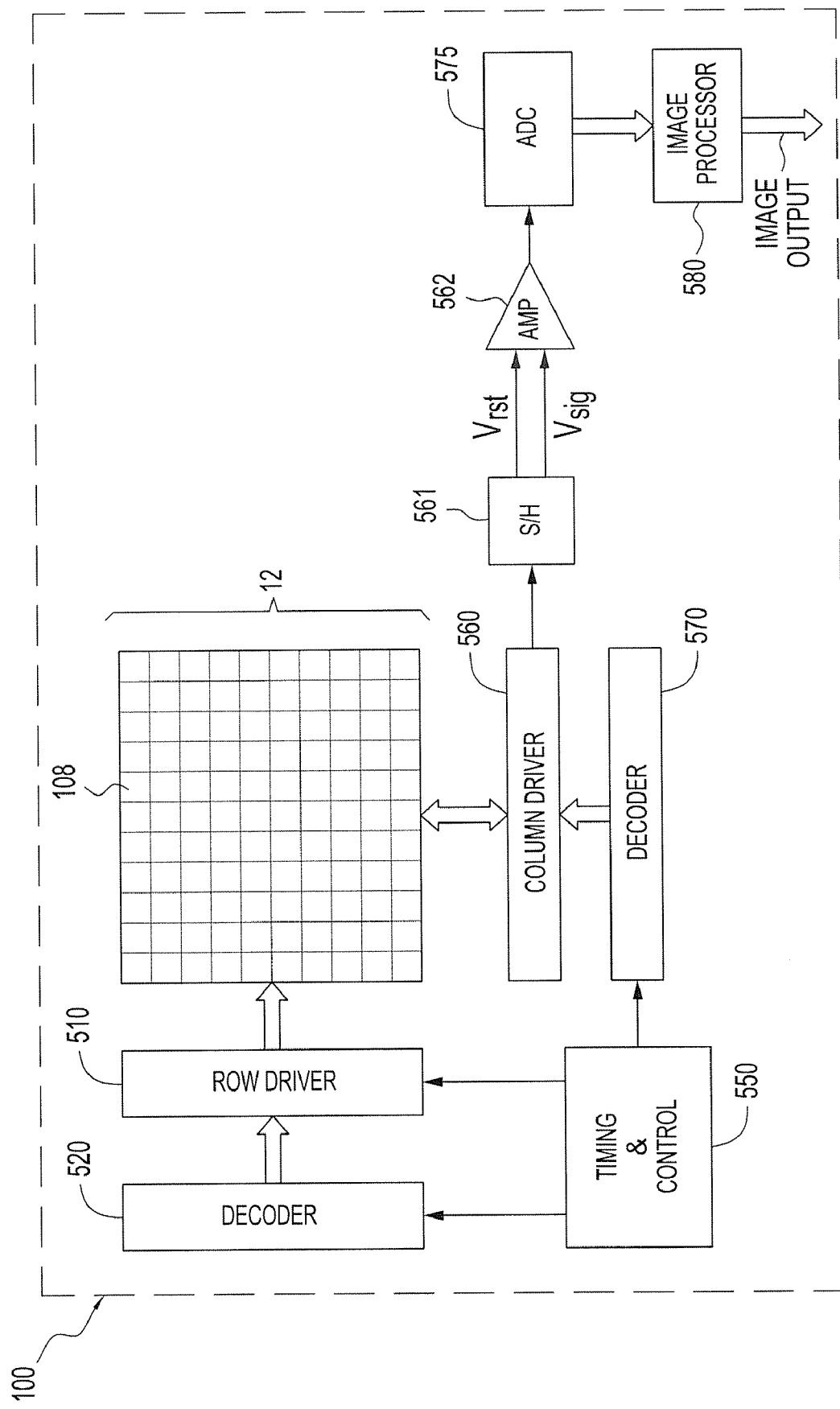
FIG. 13 is a partial top-down block diagram view of the optical package illustrated in FIG. 1.

FIG. 13 illustrates a partial top-down block diagram view of the FIG. 1 optical package 100 where a light sensing region 12 (shown as a pixel array) is covered with a lens formed in accordance with any of the embodiments described above. FIG. 13 illustrates a CMOS imager and associated readout circuitry, but the embodiments may be used with any type of imager. In operation of the optical package 100, i.e., light capture, pixel circuitry comprising photosensors 108 in each row in the light sensing region 12 are all turned on at the same time by a row select line, and the signals of the photosensors 108 of each column are selectively output onto output lines by respective column select lines. A plurality of row and column select lines are provided for the entire array. The row lines are selectively activated in sequence by the row driver 510 in response to row address decoder 520 and the column select lines are selectively activated in sequence for each row activation by the column driver 560 in response to column address decoder 570. Thus, row and column addresses are provided for each pixel circuit comprising a photosensor 108. The optical package 100 is operated by the control circuit 550, which controls address decoders 520, 570 for selecting the appropriate row and column select lines for pixel readout, and row and column driver circuitry 510, 560, which apply driving voltage to the drive transistors of the selected row and column lines.

In a CMOS imager, the pixel output signals typically include a pixel reset signal Vrst taken off of the floating diffusion region (via a source follower transistor) when it is reset and a pixel image signal Vsig, which is taken off the floating diffusion region (via a source follower transistor) after charges generated by an image are transferred to it. The Vrst and Vsig signals are read by a sample and hold circuit 561 and are subtracted by a differential amplifier 562 that produces a difference signal (Vrst−Vsig) for each photosensor 108, which represents the amount of light impinging on the photosensor 108. This signal difference is digitized by an analog-to-digital converter (ADC) 575. The digitized pixel signals are then fed to an image processor 580 which processes the pixel signals and form a digital image output. In addition, as depicted in FIG. 13, the optical package 100 is formed on a single semiconductor chip.

Figure 14:
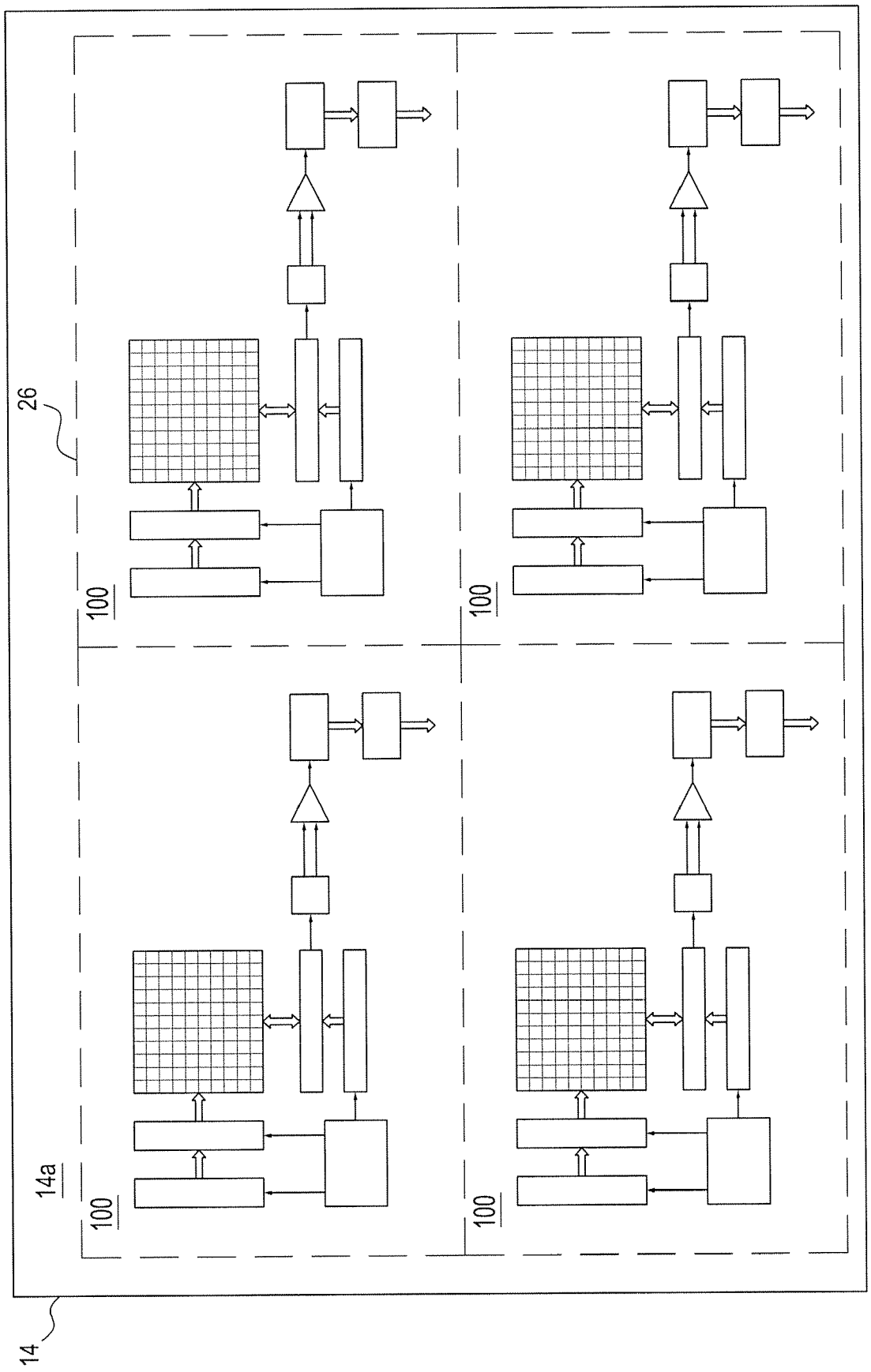
FIG. 14 is a partial top-down block diagram view of a plurality of FIG. 13 optical packages.

It should be understood by those in the art that the optical packages fabricated in accordance with the embodiments discussed above (i.e., e.g., 100, 200, 300, 300' of FIGS. 1-12) are formed on a wafer; FIG. 14 illustrates a partial top-down, block diagram of a plurality of optical packages 100 formed on a single wafer 14. Scribes 26 are illustrated on a topmost surface 14a of the wafer; it should be noted, however, that scribes 26 can be formed on a bottom surface 14b (FIG. 1) of the wafer 14 as well. Scribes 26 are typically formed on both surfaces to assist in separating each optical package 100 from the array.

Figure 15:
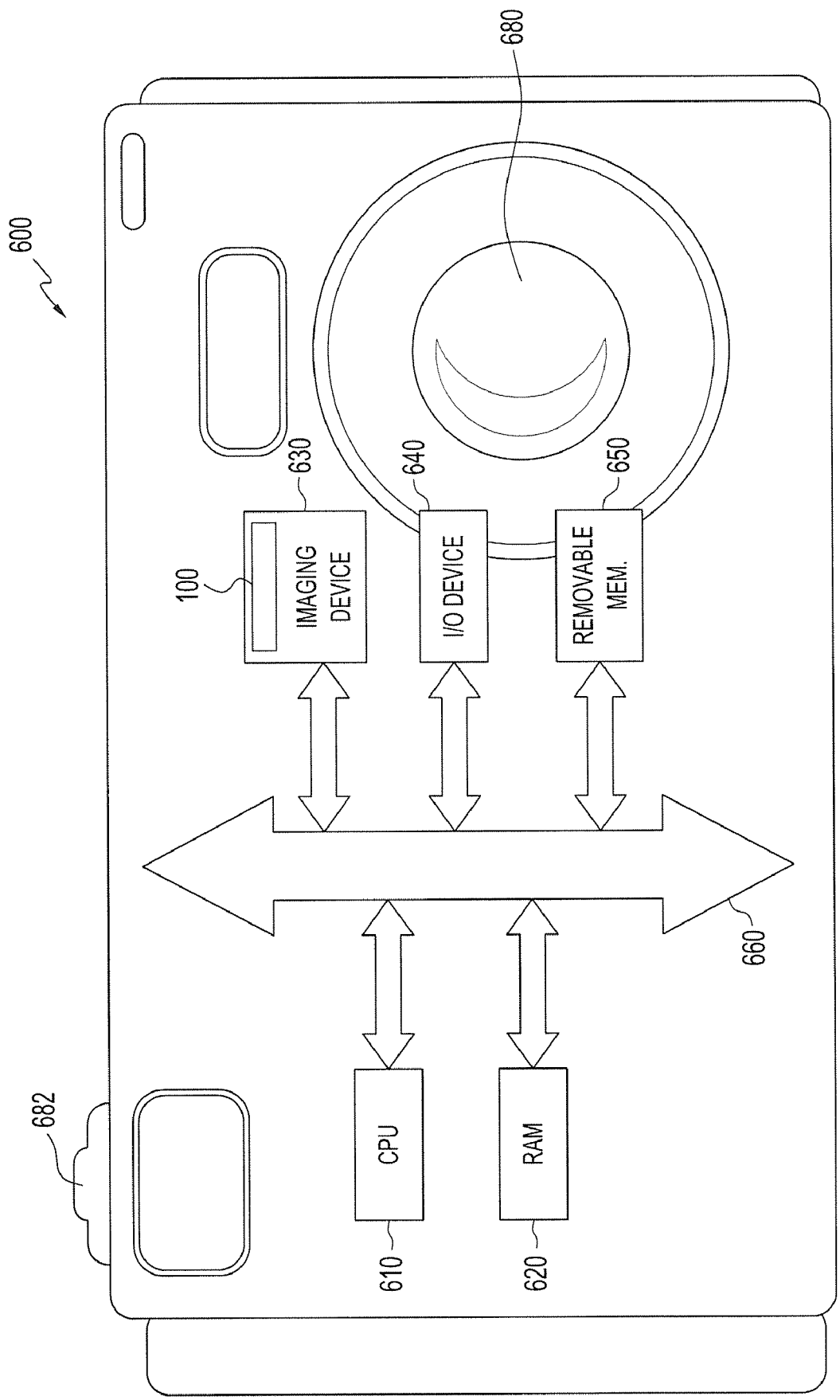
FIG. 15 illustrates a system having the optical package illustrated in FIG. 1.

FIG. 15 shows a typical system 600, such as, for example, a camera. The system 600 includes an imaging device 630 having an optical package 100. The system 600 is an example of a system having digital circuits that could include image sensor devices. Without being limiting, such a system could include a computer system, camera system, scanner, machine vision, vehicle navigation system, video phone, surveillance system, auto focus system, star tracker system, motion detection system, image stabilization system, and other systems employing an imager.

System 600, for example, a camera system, includes a lens 680 for focusing an image on the optical package 100 when a shutter release button 682 is pressed. System 600 generally comprises a central processing unit (CPU) 610, such as a microprocessor that controls camera functions and image flow, and communicates with an input/output (I/O) device 640 over a bus 660. The optical package of device 630 also communicates with the CPU 610 over the bus 660. The processor-based system 600 also includes random access memory (RAM) 620, and can include removable memory 650, such as flash memory, which also communicates with the CPU 610 over the bus 660. The imaging device 630 may be combined with the CPU 610, with or without memory storage on a single integrated circuit or on a different chip than the CPU.

It should again be noted that although the embodiments have been described with specific references to optical packages (e.g., 100, 200, 300, 300' of FIGS. 1-12) intended for light capture, the embodiments have broader applicability and may be used in any imaging apparatus, including those that require image display. For example, without limitation, embodiments may be used in conjunction with Liquid Crystal Display (LCD) technologies. In addition, although an example of use of the optical packages with CMOS image sensors have been given, the invention has applicability to other image sensors, as well as display devices.

The above description and drawings illustrate embodiments which achieve the objects, features, and advantages described. Although certain advantages and embodiments have been described above, those skilled in the art will recognize that substitutions, additions, deletions, modifications and/or other changes may be made.

The invention claimed is:

1. An intermediate structure, comprising:
    a plurality of light receiving or emitting elements formed over a substrate;
    an elastomeric layer provided over the elements; and
    at least two curable, shapeable lens layers provided between the elastomeric layer and at least two respective elements, at least one of the at least two lens layers capable of horizontal movement relative to a respective element independent of the other of the at least two lens layers.

2. The intermediate structure according to claim 1, further comprising a material layer formed below the at least two lens layers.

3. The intermediate structure according to claim 2, wherein the material layer is localized to a region over a light sensing region of the intermediate structure.

4. The intermediate structure according to claim 1, wherein at least one of the at least two lens layers is formed of a thermally curable compound.

5. The intermediate structure according to claim 1, wherein at least one of the at least two lens layers is formed of a negative photoresist.

6. The intermediate structure according to claim 1, wherein at least one of the at least two lens layers is formed of a material selected from polydimethylsiloxane (PDMS) polymer or polyethylene terephthalate (PET).

7. The intermediate structure according to claim 1, further comprising thru-wafer interconnects and solder balls for providing electrical connectivity.

8. A lens layer shaping system, comprising:

a light receiving element formed over a substrate;

a probe fixture positioned over the light receiving element;

a lens layer having shapeable properties; and a processor capable of reading output from the light receiving element and directing adjustments to the shape of the lens layer based on the reading.

9. The lens layer shaping system according to claim 8, further comprising a material layer formed below the lens layer.

10. The lens layer shaping system according to claim 9, wherein the material layer is localized to a region over a light sensing region of the light receiving element.

11. The lens layer shaping system according to claim 8, wherein the lens layer is formed of a thermally curable compound.

12. The lens layer shaping system according to claim 8, wherein the lens layer is formed of a negative photoresist.

* * * * *